(12) United States Patent
Yamamoto et al.

(10) Patent No.: US 10,496,078 B2
(45) Date of Patent: Dec. 3, 2019

(54) SUBSTRATE PROCESSING SYSTEM, SUBSTRATE PROCESSING APPARATUS AND MANAGEMENT DEVICE

(71) Applicant: HITACHI KOKUSAI ELECTRIC INC., Tokyo (JP)

(72) Inventors: Kazuyoshi Yamamoto, Toyama (JP); Osamu Ueda, Toyama (JP); Kazuhide Asai, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 12 days.

(21) Appl. No.: 15/925,346

(22) Filed: Mar. 19, 2018

(65) Prior Publication Data

US 2018/0210423 A1  Jul. 26, 2018

Related U.S. Application Data

(63) Continuation of application No. PCT/JP2015/077774, filed on Sep. 30, 2015.

(51) Int. Cl.
*G05B 19/41* (2006.01)
*G05B 19/418* (2006.01)
(Continued)

(52) U.S. Cl.
CPC ......... *G05B 19/418* (2013.01); *G05B 19/408* (2013.01); *G06F 16/13* (2019.01);
(Continued)

(58) Field of Classification Search
None
See application file for complete search history.

(56) References Cited

U.S. PATENT DOCUMENTS 7,965,373 B2 * 6/2011 Hoeks ................. G03F 7/70508
355/53
2009/0265322 A1  10/2009 Asai et al.
(Continued)

FOREIGN PATENT DOCUMENTS

JP  2000-099136 A  4/2000
JP  2008-227066 A  9/2008
(Continued)

OTHER PUBLICATIONS

Japanese Office Action dated Jan. 19, 2019 for the Japanese Patent Application No. 2017-542600.
(Continued)

*Primary Examiner* — Jason Lin
(74) *Attorney, Agent, or Firm* — Volpe and Koenig, P.C.

(57) ABSTRACT

There is provided a configuration that includes a plurality of substrate processing apparatuses and a management device for managing the plurality of substrate processing apparatuses. Upon receiving information specifying a substrate processing apparatus as a reference and file information designating a predetermined device file, the plurality of substrate processing apparatuses transmits request data including first device information and first data information to the management device. Upon receiving the request data, the management device transmits the received request data to the reference substrate processing apparatus. The reference substrate processing apparatus creates response data including second data information responding to the first data information and transmits the created response data to the management device. Upon receiving the response data, the management device transmits the received response data to the plurality of substrate processing apparatuses. The plurality of substrate processing apparatuses acquires the second data information from the response data.

13 Claims, 11 Drawing Sheets

(51) Int. Cl.
*G06F 16/13* (2019.01)
*H01L 21/02* (2006.01)
*G05B 19/408* (2006.01)

(52) U.S. Cl.
CPC .... *H01L 21/02* (2013.01); *G05B 2219/23295* (2013.01); *G05B 2219/32096* (2013.01); *G05B 2219/45031* (2013.01); *Y02P 90/02* (2015.11)

(56) References Cited

U.S. PATENT DOCUMENTS

| | | | | |
|---|---|---|---|---|
| 2011/0004334 | A1* | 1/2011 | Kobayashi | G05B 19/4189 700/112 |
| 2011/0173127 | A1* | 7/2011 | Ho | G06Q 10/00 705/317 |
| 2014/0025677 | A1 | 1/2014 | Asai et al. | |
| 2014/0058551 | A1* | 2/2014 | Morinaga | G06F 17/50 700/121 |
| 2016/0078163 | A1 | 3/2016 | Koshimaki et al. | |
| 2016/0179084 | A1* | 6/2016 | Suzuki | G06F 17/50 700/98 |

FOREIGN PATENT DOCUMENTS

| | | |
|---|---|---|
| JP | 2010-027646 A | 2/2010 |
| JP | 2014-039013 A | 2/2014 |
| WO | 2014/189045 A1 | 11/2014 |

OTHER PUBLICATIONS

International Search Report dated Dec. 22, 2015 of PCT International Application No. PCT/JP2015/077774.
Korean Office Action dated Aug. 21, 2019 for the Korean Patent Application No. 10-2018-7007423.

* cited by examiner

FIG. 6

| Identifier | Destination device | Inter-device free request | Identifier | Response to inter-device free request |
|---|---|---|---|---|
| S100F103 | EQ4 | Recipe A is required | S100F104 | Information of recipe A |

FIG. 7

| No. | Destination device | Request device | Identifier |
|---|---|---|---|
| 1 | EQ4 | EQ1 | S100F103 |

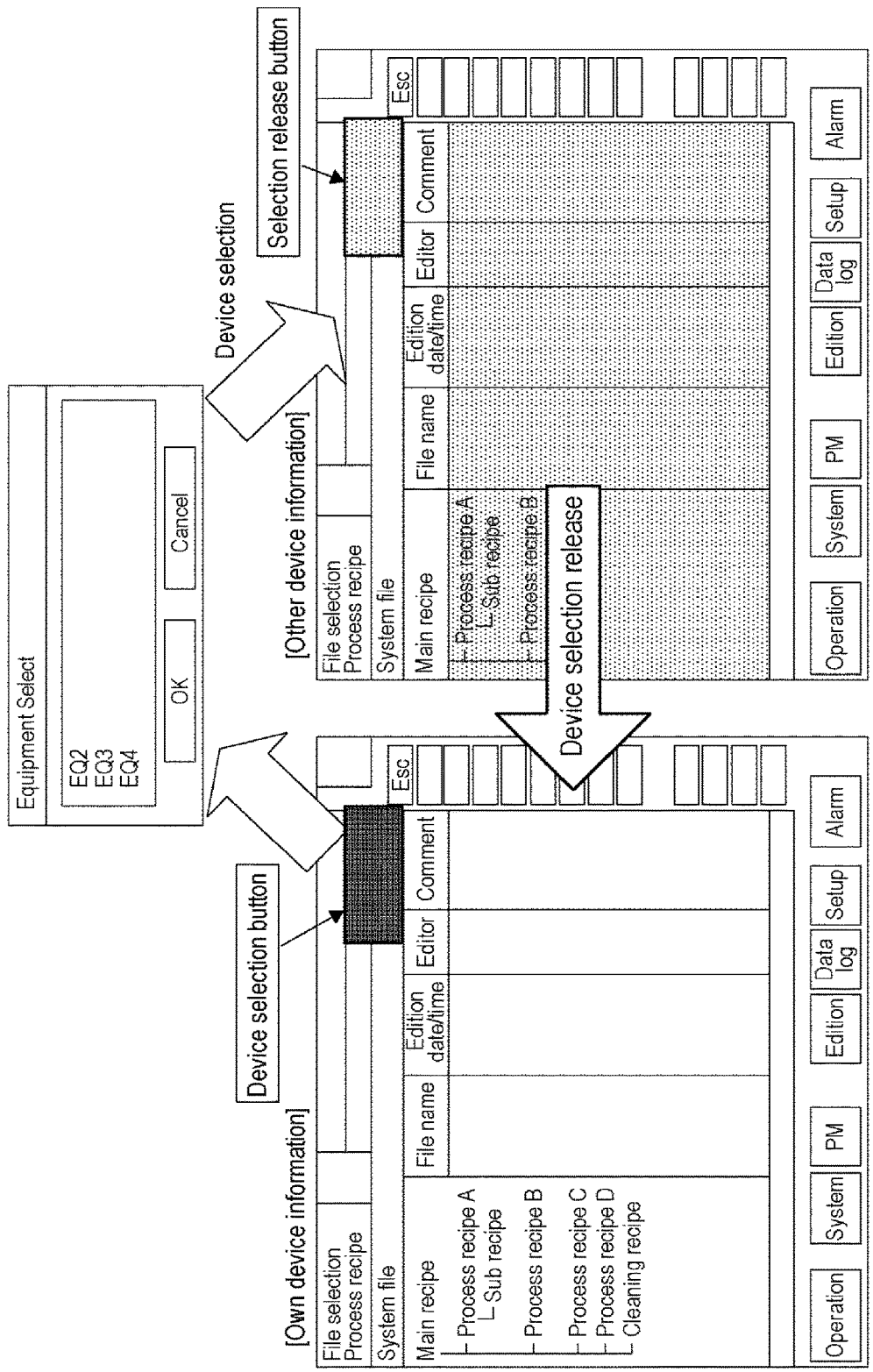

FIG. 10

| Identifier | Corresponding device list request | Identifier | Corresponding device list response |
|---|---|---|---|
| S100F101 | (null) | S100F102 | <list of device name and IP address><br>EQ1, 111.222.100.1<br>EQ2, 111.222.100.2<br>EQ3, 111.222.100.3<br>EQ4, 111.222.100.4 |

FIG. 11

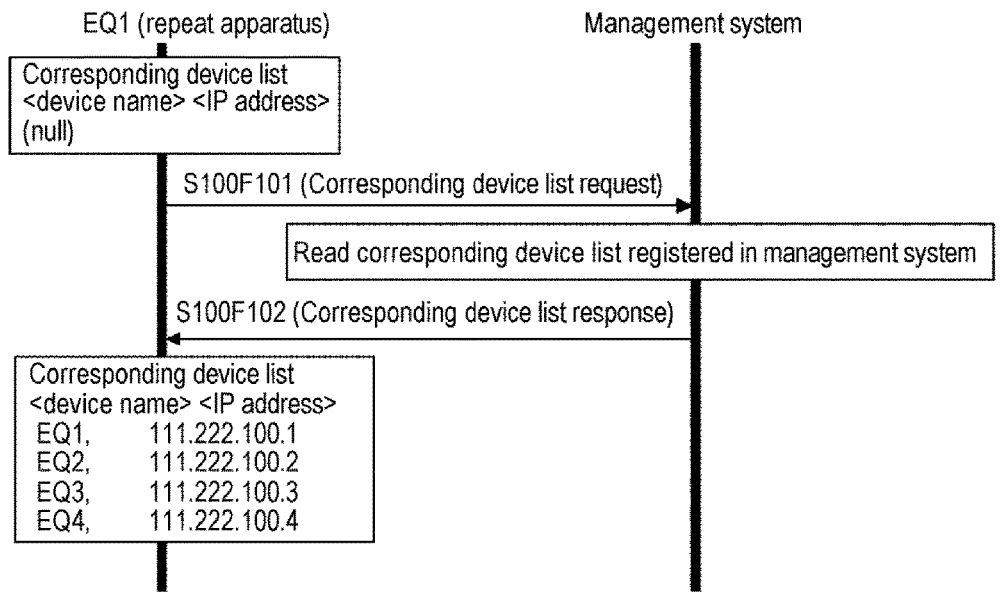

FIG. 12

| Identifier | Corresponding device list update notification | Identifier | Corresponding device list update notification response |
|---|---|---|---|
| S100F105 | <List of device name and IP address><br>EQ1, 111.222.100.1<br>EQ2, 111.222.100.2<br>EQ3, 111.222.100.3<br>EQ4, 111.222.100.4<br>EQ5, 111.222.100.5 | S100F106 | (null) |

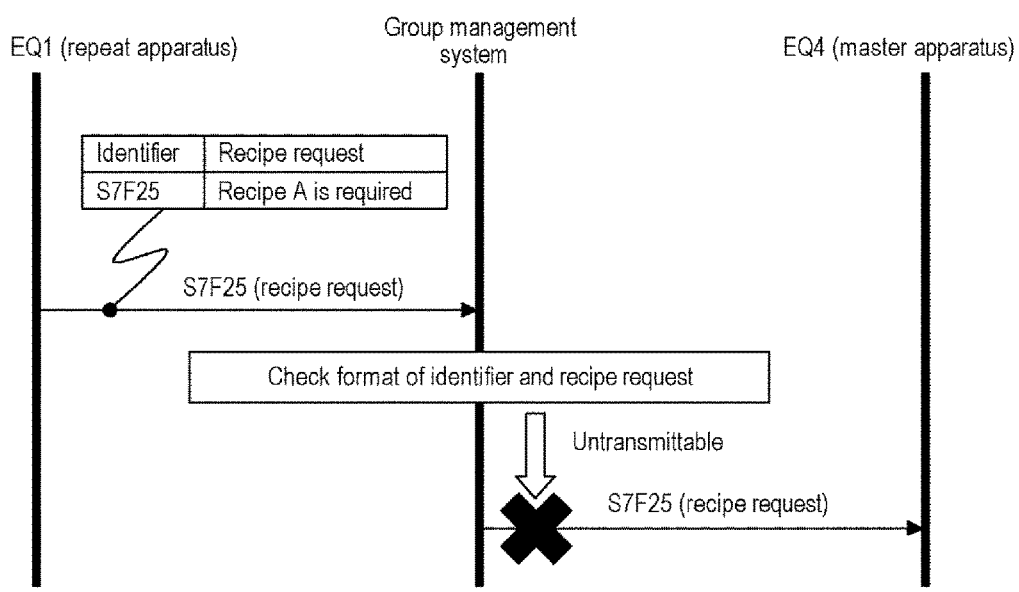

SUBSTRATE PROCESSING SYSTEM, SUBSTRATE PROCESSING APPARATUS AND MANAGEMENT DEVICE

CROSS-REFERENCE TO RELATED APPLICATION(S)

This application is a Bypass Continuation Application of PCT international Application No. PCT/JP2015/077774, filed on Sep. 30, 2015, the entire contents of which are incorporated herein by reference.

TECHNICAL FIELD

The present disclosure relates to a substrate processing system including a substrate processing apparatus for processing a substrate and a management device connected to the substrate processing apparatus.

BACKGROUND

A substrate processing apparatus for processing a substrate holds various device files including a process recipe file in which processing conditions and processing procedures are defined. In addition, one management device (hereinafter also referred to as a management system) is connected to a plurality of substrate processing apparatuses at all times so as to process information and device files of the substrate processing apparatuses.

A user of a semiconductor device maker utilizes this management system to manage a device file such as a process recipe file (hereinafter also referred to as a production recipe). Moreover, an engineer of a semiconductor manufacturing apparatus maker (hereinafter also referred to as a maintenance worker) performs management of a device file (for example, copying of a device file to another device) by using an external recording medium such as a USB memory. However, due to limitations in the use of external recording media in semiconductor factories and in order to improve work efficiency, maintenance workers also use the management system to manage device files. In this way, in the semiconductor manufacturing field, the management device (hereinafter also referred to as a management system) is utilized to improve the working efficiency.

For example, in the related art, a technique for comparing files of a plurality of apparatuses in batch and correcting differences therebetween has been disclosed. In addition, in the related art, a technique for preparing file groups (bundles of plural files) according to the purpose of use, and comparing the file groups in batch has been disclosed.

However, when a plurality of users and maintenance workers uses a single management system, there are many cases where the users take a priority over the single management system. In these cases the maintenance workers cannot use the management system, which may result in poor work efficiency.

SUMMARY

Some embodiments of the present disclosure provide a technique capable of managing device files between the substrate processing apparatuses.

According to one embodiment of the present disclosure, there is provided a configuration that includes a plurality of substrate processing apparatuses and a management device for managing the plurality of substrate processing apparatuses. Upon receiving information specifying a substrate processing apparatus as a reference and file information designating a predetermined device file, the plurality of substrate processing apparatuses transmits request data including first device information indicating the reference substrate processing apparatus and first data information associated with the predetermined device file to the management device. Upon receiving the request data, the management device transmits the received request data to the reference substrate processing apparatus. The reference substrate processing apparatus creates response data including second data information responding to the first data information based on the received request data and transmits the created response data to the management device. Upon receiving the response data, the management device transmits the received response data to the plurality of substrate processing apparatuses. The plurality of substrate processing apparatuses acquires the second data information from the response data.

BRIEF DESCRIPTION OF DRAWINGS

FIG. 6 is an illustrative example of an electronic message used for communication between substrate processing apparatuses via a management device suitably used in an embodiment of the present disclosure.

FIG. 7 is an illustrative example of an electronic message management table of a management device suitably used in an embodiment of the present disclosure.

FIG. 9 is an illustrative example of an operation screen of a substrate processing apparatus suitably used in an embodiment of the present disclosure.

FIG. 10 is an illustrative example of an electronic message used for communication between a management device and a substrate processing apparatus suitably used in an embodiment of the present disclosure.

FIG. 11 is an illustrative example of a data processing sequence between a management device and a substrate processing apparatus suitably used in an embodiment of the present disclosure.

FIG. 12 is an illustrative example of an electronic message used for communication between a management device and a substrate processing apparatus suitably used in an embodiment of the present disclosure.

FIG. 14 is an illustrative example of a data processing sequence between a management device and a substrate processing apparatus used in a comparative example.

FIG. 15 is an illustrative example of an electronic message used for communication between substrate processing apparatuses suitably used in another embodiment of the present disclosure.

DETAILED DESCRIPTION (1) Configuration of Substrate Processing System

First, the configuration of a substrate processing system according to an embodiment of the present disclosure will be described with reference to FIG. 1.

Figure 1:
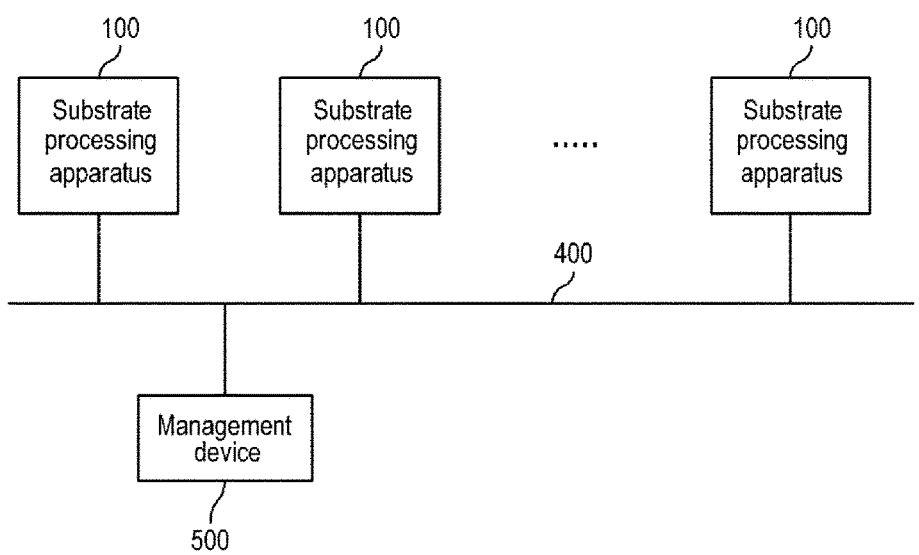
FIG. 1 is a schematic view showing the configuration of a substrate processing system including a management device suitably used in an embodiment of the present disclosure.

Referring to FIG. 1, a substrate processing system according to the present embodiment includes at least one substrate processing apparatus 100 and a management device 500 connected to the substrate processing apparatus 100 to be data-exchangeable. The substrate processing apparatus 100 and the management device 500 are connected by a network 400 such as a local area network (LAN), a wide area network (WAN) or the like.

(2) Configuration of Substrate Processing Apparatus

Subsequently, the configuration of the substrate processing apparatus 100 according to the present embodiment will be described mainly with reference to FIGS. 3 and 4. The substrate processing apparatus 100 according to this embodiment is configured as a vertical type apparatus that performs oxidation, diffusion, deposition and the like on a substrate such as a wafer.

Figure 3:
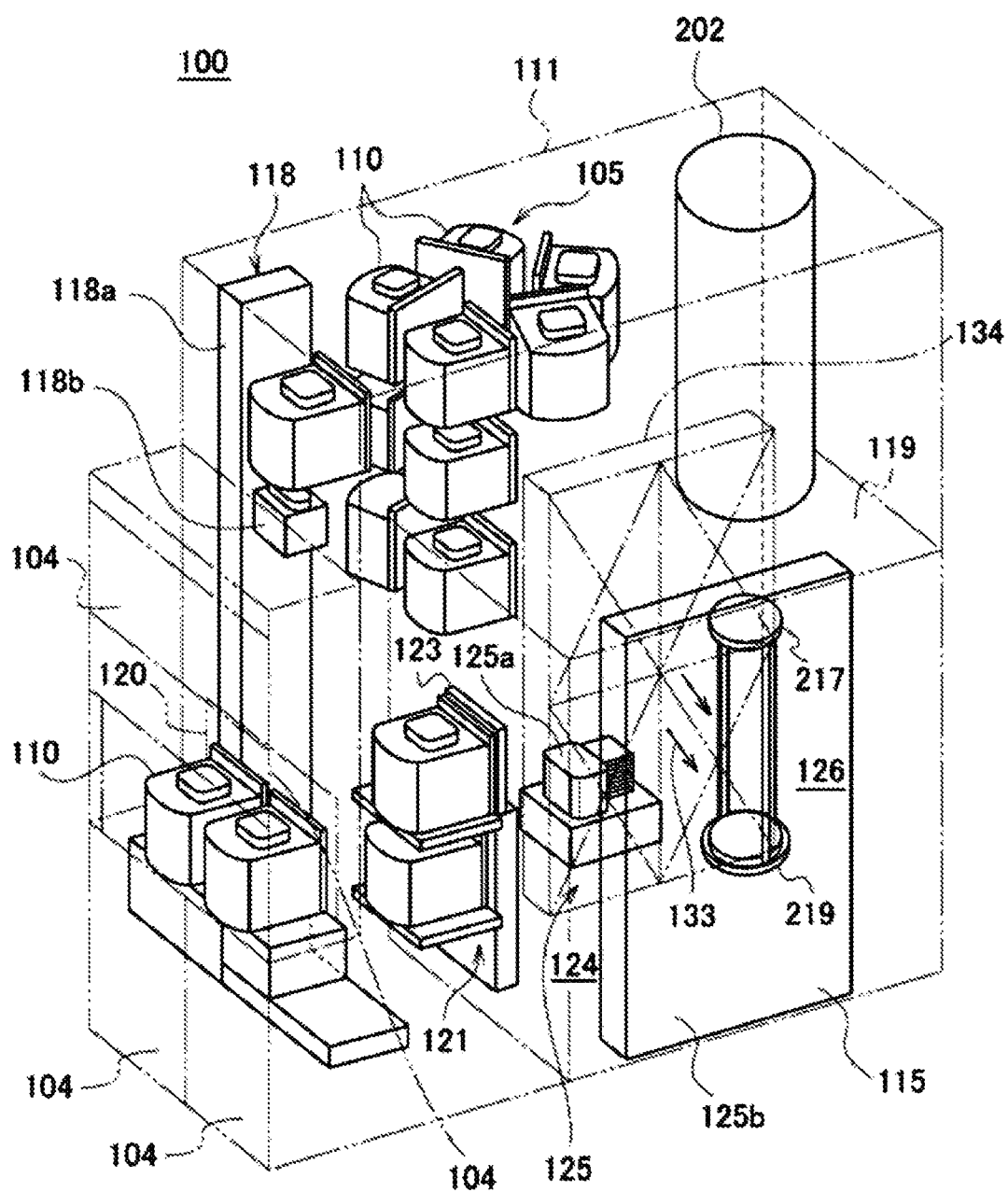
FIG. 3 is an oblique perspective view of a substrate processing apparatus suitably used in an embodiment of the present disclosure.
Figure 4:
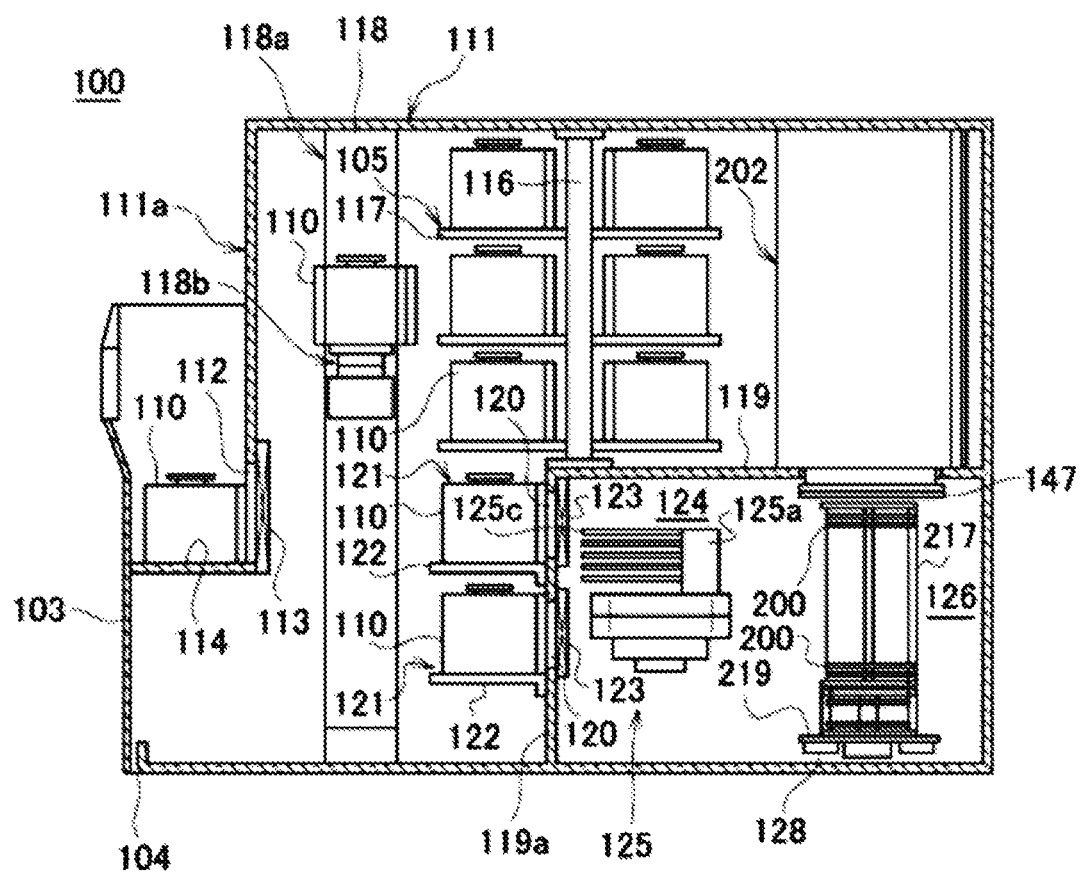
FIG. 4 is a side perspective view of a substrate processing apparatus suitably used in an embodiment of the present disclosure.

As shown in FIGS. 3 and 4, the substrate processing apparatus 100 according to this embodiment includes a housing 111 configured as a pressure resistant container. A front maintenance port 103 as an opening formed so as to be capable of maintenance is formed in front of the front wall 111a of the housing 111. A front maintenance door 104 for opening and closing the front maintenance port 103 is installed in the front maintenance port 103.

A pod 110, which is a wafer carrier (substrate container) accommodating a plurality of wafers 200 as substrates made of silicon (Si) or the like, is used to transfer the wafers 200 into/out of the housing 111. A pod loading/unloading port 112 is formed in the front wall 111a of the housing 111 so as to communicate with the inside of the housing 111 to the outside thereof. The pod loading/unloading port 112 is configured to be opened and closed by a front shutter 113. A load port 114 is installed on the front lower side of the pod loading/unloading port 112. The pod 110 is transferred by an in-process transfer device to be mounted and aligned on the load port 114.

A pod transfer device 118 is installed in the vicinity of the load port 114 in the housing 111. A rotary pod shelf 105 is installed further inside the pod transfer device 118 in the housing 111 and above the substantially central portion in the front-back direction in the housing 111.

The pod transfer device 118 is composed of a pod elevator 118a that can move up and down while holding the pod 110, and a pod transfer mechanism 118b as a transfer mechanism. The pod transfer device 118 is configured to transfer the pod 110 among the load port 114, the rotary pod shelf 105 and a pod opener 121 through sequential operation of the pod elevator 118a and the pod transfer instrument 118b.

A plurality of pods 110 is stored on the rotary pod shelf 105. The rotary pod shelf 105 is provided with a post 116 installed to be vertically erected and intermittently rotated in a horizontal plane, a plurality of shelf plates 117 radially supported at respective positions of upper, middle, and lower stages of the post 116. The plurality of shelf plates 117 is configured to be held with the plurality of pods 110 mounted thereon.

A sub-housing 119 is installed at a lower portion inside the housing 111 to extend from the substantially central portion to the rear end in the front-back direction in the housing 111. A pair of wafer loading/unloading ports 120 for transferring the wafers 200 into and out of the sub-housing 119 is vertically arranged in two stages and installed on the front wall 119a of the sub-housing 119. The pod opener 121 is installed in each of the upper and lower wafer loading/unloading ports 120.

Each pod opener 121 includes a pair of mounting tables 122 on which the pod 110 is mounted and a cap attaching/detaching mechanism 123 for attaching/detaching a cap of the pod 110. The pod opener 121 is configured to attach/detach the cap of the pod 110 mounted on the mounting table 122 by the cap attaching/detaching mechanism 123, to thereby open/close a wafer entrance of the pod 110.

A transfer chamber 124 which is fluidly isolated from a space where the pod transfer device 118, the rotary pod shelf 105 or the like are installed is configured inside the sub-housing 119. A wafer transfer mechanism 125 is installed in a front area of the transfer chamber 124. The wafer transfer mechanism 125 includes a wafer transfer device 125a that can rotate or translate the wafer 200 in the horizontal direction, and a wafer transfer device elevator 125b that moves the wafer transfer device 125a up and down. The wafer transfer device elevator 125b is installed between the right end of the front area of the transfer chamber 124 of the sub-housing 119 and the right end of the housing 111 (see FIG. 3). The wafer transfer device 125a includes a tweezer 125c as a mounting part of the wafer 200. The wafer 200 is charged/discharged onto/from a boat 217 by the consecutive operations of the wafer transfer device elevator 125b and the wafer transfer device 125a.

A standby part 126 that accommodates the boat 217 and stands by is formed in the rear region of the transfer chamber 124. A process furnace 202 for processing the water 200 is installed above the standby part 126. The lower end portion of the process furnace 202 is configured to be opened and closed by a furnace port shutter 147. The configuration of the process furnace 202 will be described later.

A boat elevator 115 for moving the boat 217 up and down is installed between the right end portion of the standby part 126 of the sub-housing 119 and the right end portion of the housing 111 (see FIG. 3). An arm 128 as a connecting member is connected to the elevating base of the boat elevator 115. A seal cap 219 as a furnace port cover is horizontally installed on the arm 128. The seal cap 219 is configured to vertically support the boat 217 and to be able to close the lower end portion of the process furnace 202.

The boat 217 is configured to horizontally hold a plurality of wafers 200 (for example, about 50 to 125 wafers) with the centers thereof aligned in the vertical direction.

As shown in FIG. 3, a clean unit 134 composed of a supply fan and a dustproof filter for supplying clean air 133, which is a cleaned atmosphere or an inert gas, is installed in the left side end portion of the transfer chamber 124, which is side located opposite from the wafer transfer device elevator 125b and the boat elevator 115. The clean air 133 blown out from the clean unit 134 is distributed around a notch aligner, the wafer transfer device 125a, and the boat 217 in the standby part 126, is sucked in by a duct, and is exhausted to the outside of the housing 111, or is circulated up to the primary side (supply side) which is the suction side of the clean unit 134 to be blown again into the transfer chamber 124 by the clean unit 134.

(3) Operation of Substrate Processing Apparatus

Next, the operation of the substrate processing apparatus 100 according to the present embodiment will be described mainly with reference to FIGS. 3 and 4. The following operation is carried out, for example, based on a transfer recipe. The transfer recipe is used for transfer of a wafer 200 into the substrate processing apparatus 100 and is applied to a substrate processing process together with, for example, a process recipe for performing substrate processing.

As shown in FIGS. 3 and 4, when the pod 110 is supplied to the load port 114, the pod loading/unloading port 112 is opened by the front shutter 113. Then, the pod 110 on the load port 114 is carried into the housing 111 from the pod loading/unloading port 112 by the pod transfer device 118.

The pod 110, which is carried in the housing 111, is automatically transferred onto the shelf plate 117 of the rotary pod shelf 105 by the pod transfer device 118 and is temporarily stored. Then, the pod 110 on the shelf plate 117 is transferred onto the mounting table 122 of one pod opener 121. The pod 110, which is carried in the housing 111, may be directly transferred onto the mounting table 122 of the pod opener 121 by the pod transfer device 118. The wafer loading/unloading port 120 of the pod opener 121 is closed by the cap attaching/detaching mechanism 123 and the clean air 133 is distributed and filled in the transfer chamber 124. For example, the transfer chamber 124 is filled with the clean air 133 such as an inert gas so that the oxygen concentration in the transfer chamber 124 is set to, for example, 20 ppm or less, which is even lower than the oxygen concentration in the housing 111 which is under an atmospheric atmosphere.

A opening side surface of the pod 110 mounted on the mounting table 122 is pressed against the opening edge portion of the wafer loading/unloading port 120 in the front wall 119a of the sub-housing 119 and its cap is removed by the cap attaching/detaching mechanism 123 to open the wafer loading/unloading port. Thereafter, the wafer 200 is picked up from the inside of the pod 110 through the wafer loading/unloading port by the tweezer 125c of the wafer transfer device 125a, aligned in the circumferential direction by the notch aligner, and then carried into the standby part 126 located behind the transfer chamber 124, to be charged into the boat 217. The wafer transfer device 125a that charged the wafer 200 into the boat 217 returns to the pod 110 and charges the next wafer 200 into the boat 217.

While charging the wafer 200 from one (upper stage or lower stage) pod opener 121 into the boat 217 by the wafer transfer mechanism 125, another pod 110 is transferred and mounted from the rotary pod shelf 105 on the mounting table 122 of the other (lower stage or upper stage) pod opener 121, and is opened by the other pod opener 121 simultaneously with the charging operation of the wafer 200.

When a predetermined number of wafers 200 are charged into the boat 217, the lower end portion of the process furnace 202 that has been closed by the furnace port shutter 147 is opened. Subsequently, as the seal cap 219 is lifted by the boat elevator 115, the boat 217 holding the wafers 200 is loaded into the process furnace 202 (boat loading).

After the boat loading, an arbitrary process is performed on the wafers 200 in the process furnace 202. After the process, except for the alignment of the wafers 200 by the notch aligner, the boat 217 charged with the processed wafers 200 is unloaded from the inside of a process chamber 201 in a substantially reverse procedure to the above-described procedure and the pod 110 storing the processed wafers 200 is unloaded out of the housing 111.

(4) Configuration of Process Furnace

Subsequently, the configuration of the process furnace 202 according to the present embodiment will be described with reference to FIG. 5.

Figure 5:
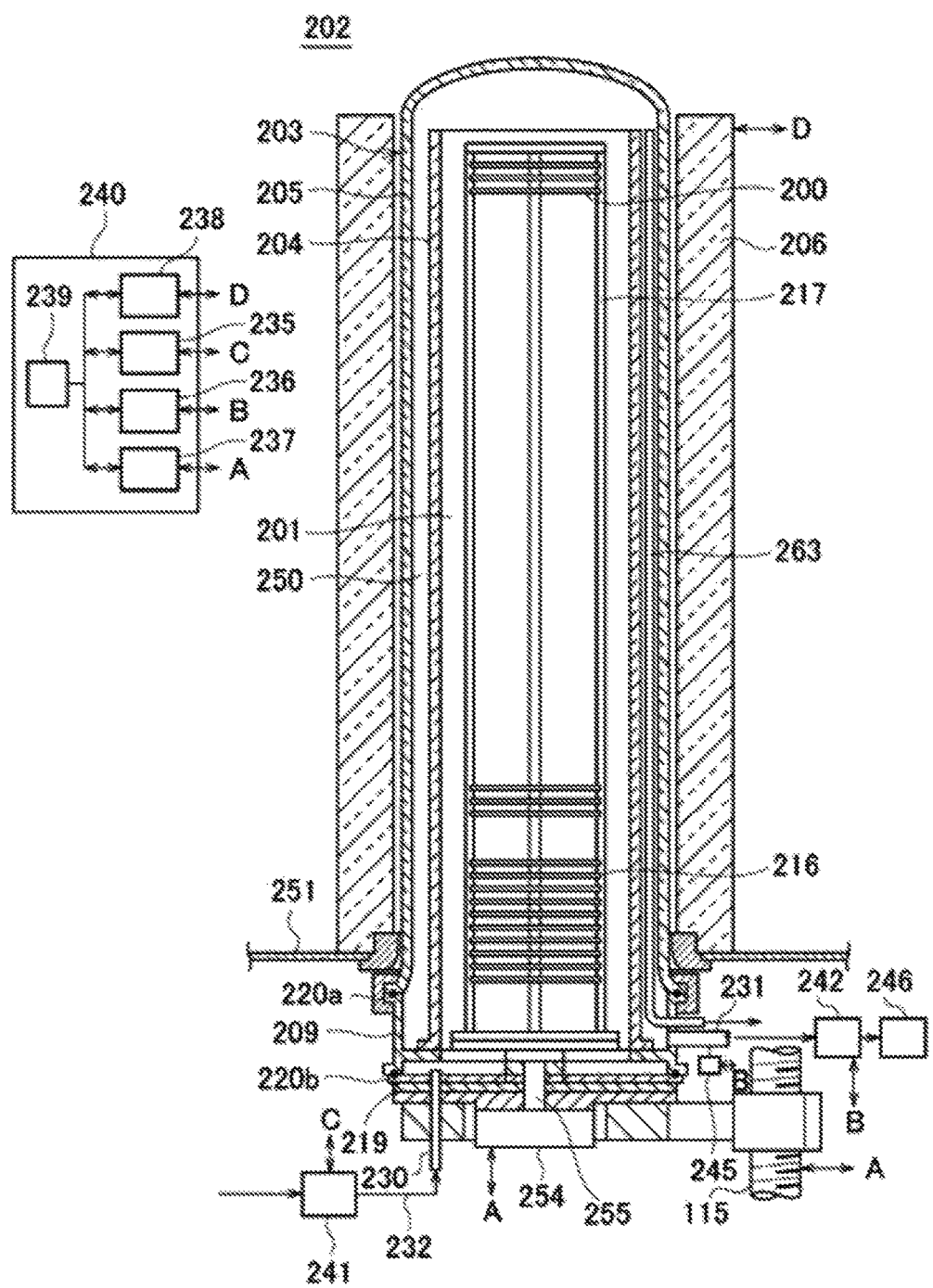
FIG. 5 is a vertical sectional view of a process furnace included in a substrate processing apparatus suitably used in an embodiment of the present disclosure.

As shown in FIG. 5, the process furnace 202 includes a process tube 203 as a reaction tube. The process tube 203 includes an inner tube 204 as an inner reaction tube and an outer tube 205 as an outer reaction tube installed outside the inner tube 204. The inner tube 204 is made of, e.g., a heat-resistant material such as quartz ($SiO_2$) or silicon carbide (SiC) and is formed in a cylindrical shape with its upper end and lower end opened. A process chamber 201 for processing a wafer 200 as a substrate is formed in a cylindrical hollow portion of the inner tube 204. The process chamber 201 is configured to accommodate a boat 217 to be described later. The outer tube 205 is formed concentrically with the inner tube 204. The outer tube 205 is formed in a cylindrical shape whose inner diameter is larger than the outer diameter of the inner tube 204, with its upper end closed and its lower end opened. The outer tube 205 is made of, e.g., a heat-resistant material such as quartz or silicon carbide.

A heater 206 as a heating mechanism is installed outside the process tube 203 so as to surround the side wall surface of the process tube 203. The heater 206 has a cylindrical shape and is vertically installed and is supported by a heater base 251 as a holding plate.

A temperature sensor 263 as a temperature detector is installed in the process tube 203. A temperature controller 237 is electrically connected to the heater 206 and the temperature sensor 263. Based on the temperature information detected by the temperature sensor 263, the temperature controller 237 adjusts power supplied to the heater 206 so that the process chamber 201 has a desired internal temperature distribution at a desired timing.

A manifold 209 is installed below the outer tube 205 so as to be concentric with the outer tube 205. The manifold 209 is made of, e.g., stainless steel or the like, and is formed in a cylindrical shape with its upper end and lower end opened. The manifold 209 is engaged with the lower end portion of the inner tube 204 and the lower end portion of the outer tube 205 so as to support them. An O-ring 220a as a seal member is installed between the manifold 209 and the outer tube 205. A reaction vessel is formed by the process tube 203 and the manifold 209.

A seal cap 219, which serves as a furnace opening cover capable of air-tightly sealing the lower end opening of the manifold 209, is installed below the manifold 209. The seal cap 219 is configured to make contact with the lower end of the manifold 209 from the lower side thereof in the vertical direction. The seal cap 219 is made of, e.g., metal such as stainless steel and is formed in a disc shape. An O-ring 220b, which serves as a seal member making contact with the lower end of the manifold 209, is installed on the upper surface of the seal cap 219. The seal cap 219 is configured to be moved up and down in the vertical direction by the boat elevator 115 as an elevating mechanism vertically installed outside the process tube 203. It is configured to load and unload the boat 217 into/out of the process chamber 201 by moving the seal cap 219 up and down.

A rotation mechanism 254 for rotating the boat is installed near the center of the seal cap 219 and at a side opposite from the process chamber 201. A rotary shaft 255 of the rotation mechanism 254 passes through the seal cap 219 and supports the boat 217 from below. The rotation mechanism 254 is configured to rotate the wafer 200 by rotating the boat 217.

A transfer controller 238 is electrically connected to the rotation mechanism 254 and the boat elevator 115. The transfer controller 238 is configured to control the rotation mechanism 254 and the boat elevator 115 to perform a desired operation at a desired timing. The transfer controller 238 is also electrically connected to the pod elevator 118a, the pod transfer mechanism 118b, the pod opener 121, the wafer transfer device 125a, the wafer transfer device elevator 125b, etc., and is configured to control them to perform a desired operation at a desired timing. A transfer system according to the present embodiment is mainly constituted by the pod elevator 118a, the pod transfer mechanism 118b, the pod opener 121, the wafer transfer device 125a and the wafer transfer device elevator 125b.

The boat 217 serving as a substrate holder is configured to hold a plurality of wafers 200 in such a state that the wafers 200 are arranged in a horizontal posture and in multiple stages, with the centers of the wafers 200 aligned with one another. The boat 217 is made of, e.g., a heat resistant material such as quartz or silicon carbide. A plurality of heat insulating plates 216 as a heat insulating member made of, e.g., a heat resistant material such as quartz or silicon carbide is arranged in multiple stages in a horizontal posture to thereby make it difficult for heat from the heater 206 to be transferred to the manifold 209 side.

A nozzle 230 as a gas introduction part is connected to the seal cap 219 so as to communicate with the inside of the process chamber 201. The downstream end of a gas supply pipe 232 is connected to the upstream end of the nozzle 230. One or more gas supply sources such as a processing gas and an inert gas, an MFC (Mass Flow Controller) 241 as a gas flow rate controller and one or more valves are installed on the gas supply pipe 232 in this order from the upstream side. A gas flow rate controller 235 is electrically connected to the MFC 241. The gas flow rate controller 235 is configured to control the MFC 241 so that the flow rate of a gas supplied into the process chamber 201 becomes a desired flow rate at a desired timing. A gas supply system according to the present embodiment is mainly constituted by the nozzle 230, the gas supply pipe 232, the MFC 241 and the valves. The gas supply sources may be included in the gas supply system.

An exhaust pipe 231 for exhausting the internal atmosphere of the process chamber 201 is installed on the side wall of the manifold 209. The exhaust pipe 231 is disposed at the lower end portion of a cylindrical space 250 formed by a gap between the inner tube 204 and the outer tube 205 and communicates with the cylindrical space 250. A pressure sensor 245 as a pressure detector (pressure detection part) for detecting the internal pressure of the process chamber 201, an APC (Auto Pressure Controller) valve 242 as a pressure regulator, and a vacuum pump 246 as a vacuum exhaust device are installed on the exhaust pipe 231 in that order from the upstream side. A pressure controller 236 is electrically connected to the APC valve 242 and the pressure sensor 245. The pressure controller 236 is configured to control the APC valve 242 so that the process chamber 201 has a desired internal pressure at a desired timing based on a pressure value detected by the pressure sensor 245. A gas exhaust system according to the present embodiment is mainly constituted by the exhaust pipe 231, the pressure sensor 245 and the APC valve 242. The vacuum pump 246 may be included in the gas exhaust system.

A substrate processing apparatus controller 240 as a controller controls the temperature controller 237 through a signal line A, the pressure controller 236 through a signal line B, the gas flow rate controller 235 through a signal line C, and the transfer controller 238. The gas flow rate controller 235, the pressure controller 236, the temperature controller 237 and the transfer controller 238 constitute a portion of the configuration of the controller 240. The configuration and operation of the controller 240 will be described later.

(5) Operation of Process Furnace

Subsequently, as one process of manufacturing a semiconductor device, a substrate processing process performed using the above-described process furnace 202 will be described. The substrate processing process is executed based on a process recipe for performing a predetermined process on the wafer 200. In addition, the process recipe may include a plurality of steps. In this embodiment, as an example of the substrate processing process based on the process recipe including the plurality of steps, a film forming process of forming a thin film on the wafer 200 will be described. In the following description, the operations of parts constituting the substrate processing apparatus 100 are controlled by the controller 240.

(Substrate Loading Step)

First, a plurality of wafers 200 is charged into the boat 217 (wafer charging), and the boat 217 holding the plurality of wafers 200 is lifted by the boat elevator 115 and is loaded into the process chamber 201 (boat loading). In this state, the seal cap 219 seals the lower end of the manifold 209 via the O-ring 220b.

(Pressure/Temperature Adjusting Step)

The interior of the process chamber 201 is vacuum-exhausted by the vacuum pump 246 so that the process chamber 201 has a desired internal pressure (degree of vacuum). At this time, the internal pressure of the process chamber 201 is measured by the pressure sensor 245 and the APC valve 242 (degree of opening of the valve) is feedback-controlled based on the measured pressure value (pressure adjustment). Further, the interior of the process chamber 201 is heated by the heater 206 so that the process chamber 201 has a desired internal temperature. At this time, the power supplied to the heater 206 is feedback-controlled based on a temperature value detected by the temperature sensor 263 (temperature adjustment). Subsequently, the rotation of the boat 217, that is, the rotation of the wafers 200, is initiated by the rotation mechanism 254. The pressure adjustment, the temperature adjustment and the rotation of the wafers 200 are continued at least until a film forming step to be described below ends.

(Film Forming Step)

When the process chamber 201 reaches the desired internal pressure and temperature, the valve installed on the gas supply pipe 232 is opened to supply a processing gas into the process chamber 201, with its flow rate controlled by the MFC 241. The processing gas supplied into the process chamber 201 rises in the process chamber 201, flows into the cylindrical space 250 from the upper end opening of the inner tube 204, and is exhausted from the exhaust pipe 231. When passing through the interior of the process chamber 201, the processing gas comes in contact with the surface of the wafers 200 and a thin film is deposited on the surfaces of the wafers 200 by a thermal CVD reaction. When a preset processing time has elapsed, the valve installed on the gas supply pipe 232 is closed to stop the supply of the processing gas into the process chamber 201.

(Purging Step)

After stopping the supply of the processing gas into the process chamber 201, an inert gas is supplied from the gas supply source into the process chamber 201 to purge the interior of the process chamber 201. As a result, residual gas and reaction products remaining in the process chamber 201 are removed.

(Atmospheric Pressure Returning/Substrate Unloading Step)

When the purging step is completed, the supply of power to the heater 206 is stopped to cool the interior of the process chamber 201 and the opening degree of the APC valve 242 is adjusted to return the internal pressure of the process chamber 201 to atmospheric pressure. Then, the boat 217 is unloaded from the process chamber 201 using the reverse procedure shown in the above-described substrate loading step (boat unloading). Then, the processed wafers 200 are discharged from the boat 217 (wafer discharging) and are stored in the pod 110, and the substrate processing process according to this embodiment is ended.

(6) Configuration of Substrate Processing Apparatus Controller

Subsequently, the configuration of the controller of the substrate processing apparatus 100 according to the present embodiment will be described with reference to FIG. 2.

The controller 240 is electrically connected to the substrate processing apparatus 100. The controller 240 is configured as a computer including a display device controller (operation unit) 239 configured as a central processing unit (CPU), a process controller 239a, an I/O controller, a transfer controller 238, a mechanical mechanism I/O 238a, a communication controller 239b as a communication means, a data holding part 239e, a data display part 240a such as a display device, and an input part 240b such as a keyboard and the like. The process controller 239a, the transfer controller 238, the communication controller 239b, the data holding part 239e, the data display part 240a and the input part 240b are configured to exchange data with the display device controller 239 via an internal bus or the like.

(Process Controller)

The I/O controller (including the gas flow rate controller 235, the pressure controller 236 and the temperature controller 237) for controlling the process furnace 202 is connected to exchange data with the process controller 239a. The process controller 239a controls the operation of the process furnace 202 through the I/O controller and is configured to collect (read out) monitor data indicating the state (temperature, gas flow rate, pressure, etc.) of the process furnace 202.

(Transfer Controller)

The mechanical mechanism I/O 238a is connected to exchange data with the transfer controller 238. The respective parts (for example, the pod elevator 118a, the pod transfer mechanism 118b, the pod opener 121, the wafer transfer mechanism 125, the boat elevator 115, the rotation mechanism 254 and the like) constituting the substrate processing apparatus 100 are connected to the mechanical mechanism I/O 238a. The transfer controller 238 controls the operations of the respective parts constituting the substrate processing apparatus 100 via the mechanical mechanism I/O 238a and is configured to collect (read out) monitor data indicating the states (for example, a position, an open/close state, whether each part is in operation or in a wait state, etc.) of the respective parts constituting the substrate processing apparatus 100.

(Data Holding Part)

A control program for realizing various functions for the controller 240 is stored in the data holding part 239e. For example, monitor data and the like, which are read from the I/O controller (including the gas flow rate controller 235, the pressure controller 236 and the temperature controller 237) or the transfer controller 238, are readably stored in the data holding part 239e. The data holding part 239e is composed of, for example, a flash memory, an HDD (Hard Disk Drive), an EEPROM (Electrically Erasable and Programmable Read Only Memory) or the like.

In addition, a device file is readably held (stored) in the data holding part 239e. The device file is, for example, a process recipe file in which processing conditions and processing procedures of a substrate processing process performed in the process furnace 202 are defined. Further, the device file includes, for example, a sub recipe file in which a sub recipe is written, a temperature control file in which a PID table for temperature control is written, a pressure control file in which a PID table for pressure control is written, a transfer parameter file in which transfer parameters are written, and the like.

Here, in order to execute the process recipe, it is necessary to read the contents of the process recipe file and the contents of all device files including the related files associated with the process recipe file. For example, in the present embodiment, the process recipe can be executed by reading the process recipe file and device files including the related files such as the sub recipe file, the temperature control file, the pressure control file, the transfer parameter file and the like, which are associated with the process recipe file.

The above-described process recipe and sub recipe are combined to cause the controller 240 to execute each procedure in the substrate processing process to obtain a predetermined result, and function as a program.

In addition, in the present embodiment, a program that enables the device to independently exchange screen information or file information between devices via the management device 500 (hereinafter abbreviated as a file management program) is stored in the data holding part 239e. Details of this file management program will be described later. In addition, when the file management program is executed, a corresponding device list acquired from the management device 500 is stored in the data holding part 239e. A process related to the acquisition of the corresponding device list will be described later in the same way as the file management program.

(Communication Controller)

The communication controller 239b is configured to receive the monitor data indicating the state (temperature, gas flow rate, pressure, etc.) of the process furnace 202, which are read through the I/O controller (including the gas flow rate controller 235, the pressure controller 236 and the temperature controller 237), via the process controller 239a and the display device controller 239, and transmit the monitor data to the group management device 500. In addition, the communication controller 239b is configured to receive the monitor data indicating the states (for example, a position, an open/close state, whether each part is in operation or in a wait state, etc.) of the respective parts constituting the substrate processing apparatus 100, which are read through the mechanical mechanism I/O 238a, via the transfer controller 238 and the display device controller 239, and transmit the monitor data to the group management device 500. Further, the communication controller 239b is connected to exchange data with the group management device 500, which will be described later, via the network 400.

(Display Device Controller)

The display device controller 239 is configured to read and execute the control program from the data holding part 239e. Upon receiving an input (such as an input of an operation command) from the input part 240b, the display device controller 239 is configured to read, for example, the process recipe or the like from the data holding part 239e in response to the input from the input part 240b. Then, the display device controller 239 is configured to control the gas flow rate adjustment operation by the gas flow rate controller 235, the pressure adjustment operation by the pressure controller 236, the temperature adjustment operation by the temperature controller 237, etc. so as to conform to the contents of the read process recipe. In addition, the display device controller 239 is configured to receive an input (such as an operation command input) from the input part 240b by a maintenance worker and display a state display screen, an operation input reception screen and the like of the substrate processing apparatus 100 on the data display part 240a.

In addition, the display device controller 239 is configured to realize the following functions by reading and executing the file management program from the data holding part 239e. That is, upon receiving an instruction from a maintenance worker, one substrate processing apparatus 100 transmits a request electronic message shown in FIG. 6 to be described later to another substrate processing apparatus 100. Upon receiving the request electronic message, another substrate processing apparatus 100 transmits a response electronic message (responding to this request electronic message) shown in FIG. 6 to the one substrate processing apparatus 100. The electronic message used herein is defined as a bundle of data, which are described according to a certain format and transmitted/received between computers (controllers). Further, in the present embodiment, an electronic message indicating request content from a certain substrate processing apparatus (hereinafter also referred to as a repeat apparatus) 100 is called a request electronic message and an electronic message indicating response content from another substrate processing apparatus (hereinafter also referred to as a master apparatus) 100 is called a response electronic message. Further, in the present embodiment, the master apparatus 100 refers to a substrate processing apparatus 100 serving as a reference for setting up a plurality of substrate processing apparatuses 100 having the same specifications, and the repeat apparatus 100 refers to substrate processing apparatuses 100 of the same specifications to be set up after setting up the master apparatus 100. In addition, an identifier is data for identifying one electronic message from another (or specifying the content of an electronic message). In the following description, an identifier defined in the request electronic message is sometimes referred to as a first identifier and an identifier defined in the response electronic message is sometimes referred to as a second identifier.

Next, the electronic messages shown in FIG. 6 will be described. In FIG. 6, the left electronic message (that is, the electronic message specified by the first identifier (S100F103)) is a request electronic message and the right electronic message (that is, the electronic message specified by the identifier (S100F104)) is a response electronic message. Here, the request electronic message is an electronic message defined by three items, which include the first identifier, device information (described as a destination device in FIG. 6) for specifying a device of a transmission destination of an electronic message to be requested as first device information, and data request information (described as an inter-device free request in FIG. 6) indicating the content of data requested in an electronic message as first data information. The response electronic message is an electronic message defined by two items, which include the second identifier and data response information (described as a response to the inter-device free request in FIG. 6) indicating the content of a response to data requested in the request electronic message as second data information. Here, in actual communication, since HSMS uses TCP/IP, the actual data has a header part (IP header) including unique information of data such as a transmission IP address, and a data part including the above electronic messages.

Next, the file management program is automatically executed when the power of the repeat apparatus 100 is turned on, or is automatically executed when an additional substrate processing apparatus 100 is registered in the management device 500, or is executed by an input from a user or a maintenance worker or the like. First, a process of acquiring a corresponding device list by the file management program executed when the repeat apparatus 100 is powered-on will be described with reference to FIGS. 10 and 11.

In FIG. 10, the left electronic message (that is, the electronic message specified by the first identifier (S100F100) is a request electronic message and the right electronic message (that is, the electronic message specified by the second identifier (S100F102)) is a response electronic message. Here, in actual communication, since HSMS uses TCP/IP, the actual data has a header part (IP header) including unique information of data such as a transmission IP address, and a data part including the above electronic messages. Then, as shown in FIG. 11, a process of acquiring a corresponding device list managed by the management device 500 between the management device 500 and the substrate processing apparatus 100 is executed.

Initially, the repeat apparatus 100 transmits the request electronic message specified by the first identifier (S100F101) to the management device (management system) 500. Upon receiving this request electronic message, the management device 500 reads the corresponding device list registered in advance, uses the unique information (device name and IP address) of each substrate processing apparatus 100 connected thereto as response information to create the response electronic message to be specified by the second identifier (S100F102) with this corresponding device list, and transmits the created response electronic message to the repeat apparatus 100. Upon receiving the response electronic message, the repeat apparatus 100 reads the response information corresponding to this corresponding device list and stores the corresponding device list in the data holding part 239e.

Next, a process of updating the corresponding device list by the file management program executed by an input of a user or a maintenance worker when an additional substrate processing apparatus 100 is registered in the management device 500 will be described with reference to FIGS. 12 and 13.

In FIG. 12, the left electronic message (that is, the electronic message specified by the first identifier (S100F105)) is a request electronic message and the right electronic message (that is, the electronic message specified by the second identifier (S100F106) is a response electronic message. Here, in actual communication, since HSMS uses TCP/IP, the actual data has a header part (IP header) including unique information of data such as a transmission IP address, and a data part including the above electronic messages. Then, as shown in FIG. 13, along with the update of the corresponding device list having the unique information of each substrate processing apparatuses 100 managed by the management device 500, a process of updating the corresponding device list of the substrate processing apparatus 100 between the management device 500 and the substrate processing apparatus 100 is executed.

First, when a new substrate processing apparatus (equipment (EQ)5) 100 is additionally registered, the management device 500 transmits an electronic message to be specified by the first identifier (S100F105) from the file management program to each of the substrate processing apparatuses (EQ1 to EQ4) 100 connected thereto. When the corresponding device list is updated in each of the substrate processing apparatuses (EQ1 to EQ5) 100, the response electronic message specified by the second identifier (S100F106) is transmitted from each of the substrate processing apparatuses (EQ1 to EQ5) 100 to the management device 500. In this way, as shown in FIG. 13, the process of updating the corresponding device list managed by the management device 500 between the management device 500 and the substrate processing apparatus 100 is executed.

Figure 13:
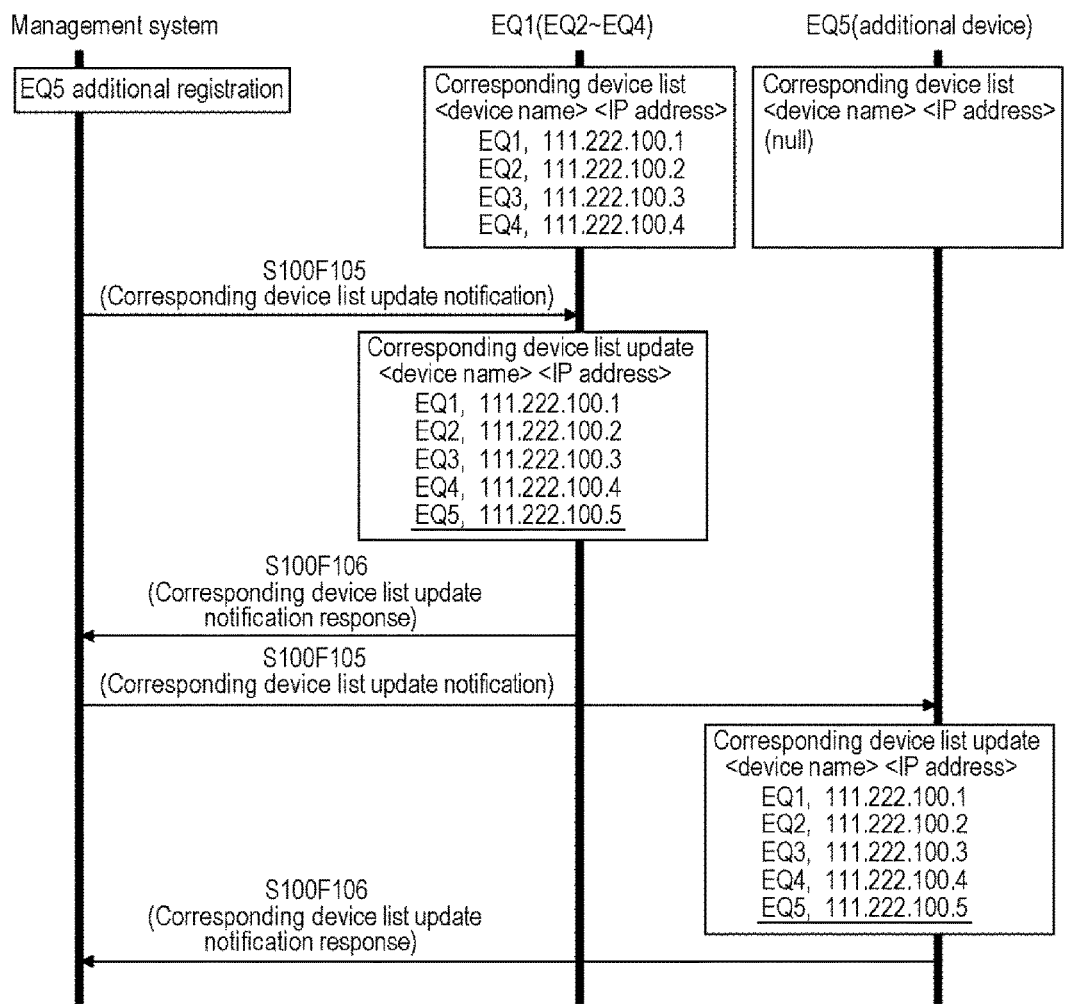
FIG. 13 is an illustrative example of a data processing sequence between a management device and a substrate processing apparatus suitably used in an embodiment of the present disclosure.

When the processes related to the acquisition and update of the corresponding device list managed by the management device 500 as shown in FIGS. 11 and 13 are completed by the file management program, for example, a process that the repeat apparatus 100 acquires a process recipe A (described as a recipe A in FIG. 6) of the substrate processing apparatus (master apparatus) 100 serving as a reference in this embodiment is performed. The device file acquisition process according to the present embodiment may be executed by a user or a maintenance worker.

Figure 8:
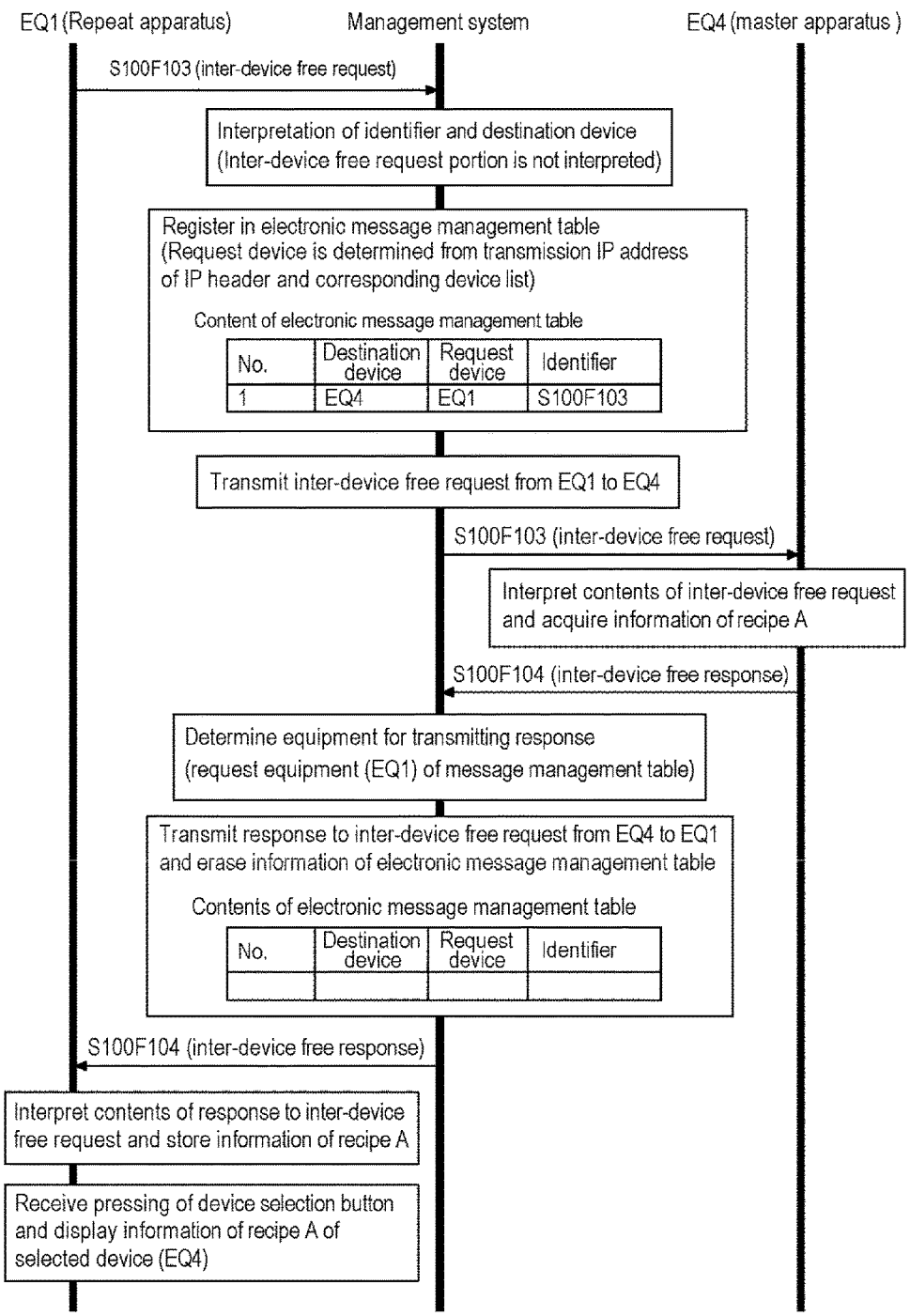
FIG. 8 is an illustrative example of a processing sequence used for communication between substrate processing apparatuses suitably used in an embodiment of the present disclosure.

As shown in FIG. 8 to be described later, first, the repeat apparatus 100 transmits the request electronic message specified by the first identifier (S100F103) to the management device 500. The management device 500 transmits the request electronic message to the master apparatus 100 which is a substrate processing device of the transmission destination specified in this request electronic message. Upon receiving this request electronic message, the master apparatus 100 transmits a response electronic message responding to the request electronic message to the management device 500. Then, the management device 500 transmits the response electronic message to the repeat apparatus 100. At this time, since the management device 500 is configured to transmit the electronic message shown in FIG. 6 without converting or interpreting the electronic message, it is possible to make direct exchange of predetermined data (for example, a device file) between the substrate processing apparatuses (between the repeat apparatus and the master apparatus) substantially without passing through the management device.

Then, as shown in FIG. 8 to be described later, after the file management program of the present embodiment is executed and the device file acquisition process from the substrate processing apparatus (master apparatus) 100 to the substrate processing apparatus (repeat apparatus) 100 is completed, information of the substrate processing apparatus (master apparatus) 100 can be displayed on the operation screen of the substrate processing apparatus (repeat apparatus) 100. For example, as shown in FIG. 9 to be described later, the information of the substrate processing apparatus (repeat apparatus) 100 and the information of the substrate processing apparatus (master apparatus) 100 may be displayed to be clearly distinguished from each other.

(7) Configuration of Management Device

Next, the configuration of the management device 500 according to the present embodiment configured to exchange data with the above-described substrate processing apparatus 100 will be described mainly with reference to FIG. 2.

Figure 2:
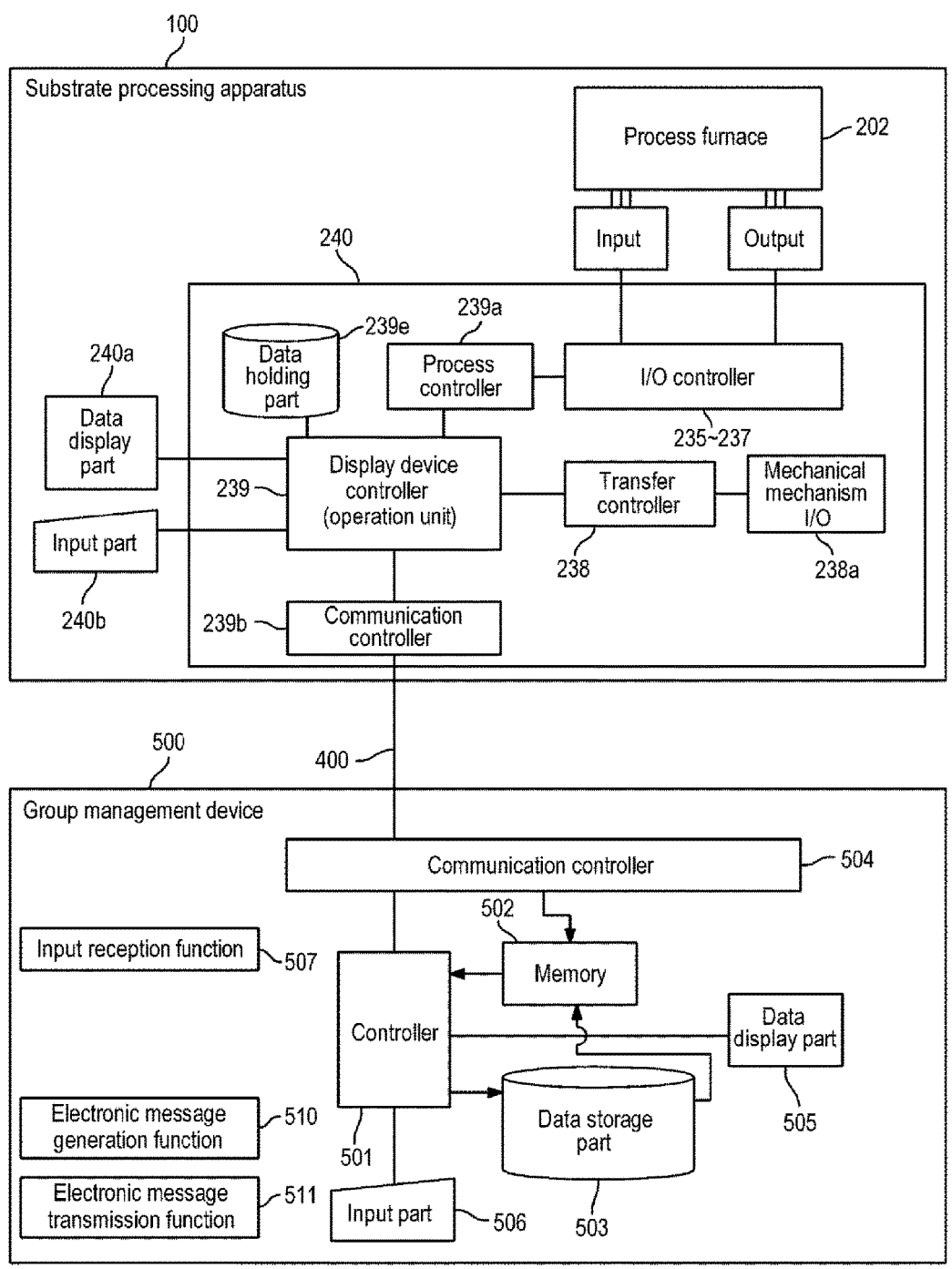
FIG. 2 is a block diagram showing the configuration of a substrate processing apparatus and a management device suitably used in an embodiment of the present disclosure.

As shown in FIG. 2, the management device 500 is configured as a computer including a controller 501 configured as a central processing unit (CPU), a memory (RAM) 502 including an internal shared memory area, a data storage part 503 as a storage device such as a flash memory, HDD or EEPROM, a data display part 505 as a display means such as, for example, a display device or the like, an input part 506 of a keyboard or the like, and a communication controller 504 as a communication means. The memory 502, the data storage part 503, the data display part 505, the input part 506 and the communication controller 504 are configured to exchange data with the controller 501 via an internal bus or the like.

As described above, the communication controller 504 is connected to the communication controller 239b of the controller 240 via the network 400 to be data-exchangeable. The communication controller 504 is configured to receive data from the substrate processing apparatus 100 and deliver the data to the memory 502 or transmit the data stored in the memory 502 to the substrate processing apparatus 100. The data delivered to the memory 502 may include, for example, monitor data acquired from the I/O controller (including the gas flow rate controller 235, the pressure controller 236 and the temperature controller 237) or the mechanical mechanism I/O 238a. The timing at which the communication controller 504 receives data from the substrate processing apparatus 100 may include, for example, the timing at which an input (input of an operation command, etc.) from the input part 506 is received.

Various management programs are stored in the data storage part 503. For example, a data collection program to be data-exchangeable with the communication controller 239b is stored. In the present embodiment, an electronic message management table as shown in FIG. 7 is stored in the data storage part 503. This electronic message management table is defined with four items, which include an item number, a destination device (first device information), a request device as second device information, and an identifier. Here, the destination device represents data indicating the master apparatus 100 which is the transmission destination of the request electronic message from the repeat apparatus 100, and the request device represents data indicating the repeat apparatus 100 of the transmission source. In other words, the destination device represents data indicating the master apparatus 100 that is the transmission source of the response electronic message, and the request device is data indicating the repeat apparatus 100 that is the transmission destination from the master apparatus.

A corresponding device list is also stored in the data storage part 503. When the management program is executed, first, the substrate processing apparatus 100 acquires a corresponding device list from the management device 500. By allowing the substrate processing apparatus 100 to hold the corresponding device list held by the management device 500, a user or a maintenance worker can designate a substrate processing apparatus 100 as a reference for file acquisition. According to the present embodiment, a process of acquiring the corresponding device list is also executed by the file management program, but this process may be executed by another program (for example, a list acquisition program) regardless of the above format.

When the file management program is executed, the controller 501 deploys this electronic message management table. Upon receiving a request electronic message from the repeat apparatus 100, the controller 501 is configured to add an item number, register data corresponding to the destination device, the request device and the identifier in the electronic message management table, and transmit the request electronic message to the master apparatus 100 designated as the destination device. Upon receiving a response electronic message from the master apparatus 100, the controller 501 is further configured to transmit this response electronic message to the repeat apparatus 100 corresponding to the request device of the electronic message management table and erase all contents registered in this electronic message management table.

As shown in FIG. 2, for example, when a maintenance worker presses a button, an input reception function 507 receives, from the input part 506, device identification information for identifying a substrate processing apparatus 100 and information for identifying a device file.

While the file management program is being executed, the controller 501 realizes an electronic message generation function 510 and, upon receiving the request electronic message specified by the identifier (S100F101), generates a response electronic message specified by an identifier (S100F102) responding to the request electronic message. In addition, when an additional substrate processing apparatus 100 is connected to the management device 500, the controller 501 generates an electronic message specified by an identifier (S100F105). However, this electronic message may be generated by an operation from a user or a maintenance worker.

By executing the file management program, the controller 501 is configured to realize an electronic message transmission function 511, transmit a request electronic message (the electronic message specified by the identifier (S100F103) in this embodiment), which is transmitted from the repeat apparatus 100, to the master apparatus 100 of the transmission destination, and transmit a request electronic message (the electronic message specified by the identifier (S100F104) in this embodiment), which is transmitted from the master apparatus 100, to the repeat apparatus 100 of the transmission source. Further, the controller 501 is configured to generate an electronic message specified by the identifier (S100F105) and transmit it to each of the substrate processing apparatuses 100 connected thereto.

(8) Operation of File Management Program

Subsequently, the operation of the file management program executed by the substrate processing apparatus 100 and the management device 500 according to the present embodiment will be described mainly with reference to FIGS. 6 to 9 and additionally FIGS. 10 to 13. In the present embodiment, an example of copying the contents of the process recipe A (described as the recipe A in FIG. 6) of the master apparatus 100 to the process recipe file of the repeat apparatus 100 will be described.

(Corresponding Device List Acquiring Step)

As shown in FIGS. 10 and 11, when the substrate processing apparatus 100 is powered-on, or, for example, when an operator presses a button (the input part 240b), the file management program is executed so as to acquire a corresponding device list from the management device 500. Specifically, when the repeat apparatus 100 is powered-on and the file management program is automatically executed, the repeat apparatus 100 checks a corresponding device list including unique information (device name and IP address) of the substrate processing apparatus, transmits a request electronic message (the electronic message specified by the identifier (S100F101)) requesting the list to the management device 500. Then, the management device 500 transmits the corresponding device list to the management device 500 according to a response electronic message (the electronic message specified by the identifier (S100F102)). Then, the repeat apparatus 100 acquires a corresponding device list based on the contents of the response electronic message and stores it in the data holding part 239e.

As shown in FIGS. 12 and 13, at a state that the file management program is executed, when the input reception function 507 of the management device 500 receives the device identification information identifying the substrate processing apparatus (EQ5) 100 from the input part 506 and receives an input for additionally registering the substrate processing apparatus (EQ5) 100, the controller 501 notifies each of the substrate processing apparatuses (EQ1 to EQ5) 100 of the update of the corresponding device list and updates the corresponding device list.

Specifically, upon receiving an input for additionally registering the substrate processing apparatus (EQ5) 100, the controller 501 transmits a request electronic message (the electronic message specified by the identifier (S100F105)) indicating that the corresponding device list has been updated. Upon receiving this request electronic message, each of the substrate processing apparatuses (EQ1 to EQ4) 100 adds the newly added substrate processing apparatus (EQ5) 100 to the corresponding device list and transmits a response electronic message (the electronic message specified by the identifier (S100F106)). Upon receiving this request electronic message, the newly added substrate processing apparatus (EQ5) 100 is configured to copy the corresponding device list, store it in the data holding part 239e, and transmit the response electronic message (the electronic message specified by the identifier (S100F106)) to the management device 500.

(File Acquiring Step)

When the input parts 240b receives an input of the device identification information (for example, the master apparatus 100 serving as a reference) and the information identifying a device file (for example, the process recipe file), the repeat apparatus 100 transmits a request electronic message (the electronic message including the first identifier (S100F103), the first device information related to the master apparatus 100, and the first data information related to the device file) to the management device 500. Upon receiving the request electronic message, the management device 500 reads the first identifier and the first device information, compares the unique information (the IP address of the IP header portion) of the data with a corresponding device list registered in advance to calculate second device information, registers the calculated second device information added with an item number in the electronic message management table, and transmits the request electronic message from the repeat apparatus (EQ1) 100 to the master apparatus (EQ4) 100.

Upon receiving this request electronic message, the master apparatus (EQ4) interprets the contents of the first data information, acquires the information of the recipe A, uses the acquired information of the recipe A as the second data information to generate a response electronic message (the electronic message including the second identifier and the second data information), and transmits the generated response electronic message to the management device 500. The management device 500 compares the unique information (transmission IP address) of the data with the corresponding device list registered in advance to calculate the first device information, and searches the electronic message management table to determine the repeat apparatus (EQ1) 100. Then, the response electronic message is transmitted from the master apparatus (EQ4) 100 to the repeat apparatus (EQ1) 100 and the information in the electronic message management table is erased. Then, the repeat apparatus (EQ1) 100 reads the contents of the second data information and stores the information of the recipe A in the data holding part 239*e*.

Here, the information of the recipe A is information including the contents of the recipe A (process recipe file) and the contents of all the device files including the related file associated with the recipe A (process recipe file). In addition, by the file management program, information of either recipe A between the repeat apparatus (EQ1) 100 and the master apparatus (EQ4) 100 can be displayed on the data display part 240*a*.

Although it is illustrated in the present embodiment that the file management program has the corresponding device list acquiring step and the file acquiring step but does not include an information displaying step to be described later, the information displaying step may also be included in the file management program. However, it is unnecessary to automatically display the result of data copy (file copy) between the substrate processing apparatuses 100, but a user or a maintenance worker may display the result as necessary. Accordingly, a device selection button to be described later is displayed on the operation screen.

(Information Displaying Step)

Subsequently, displaying the information of the recipe A will be described. After executing the file management program, a device selection button may be displayed on the data display part 240*a* that displays the recipe information. Then, when the device selection button is pressed, the recipe information of a selected substrate processing apparatus can be displayed.

The switching operation of a recipe information screen displayed on the data display part 240*a* of the substrate processing apparatus (EQ1) will be described with reference to a portion of FIG. 8 and FIG. 9.

When the device selection button displayed on the data display part 240*a* of the substrate processing apparatus (EQ1) 100 is pressed down, the device selection screen is displayed. This device selection screen may be a pop-up display or a screen switching display. Other substrate processing apparatuses (EQ2 to EQ4 in the embodiment) 100 connected to the management device 500 defined in the corresponding device list are selectably displayed on the device selection screen. Then, the recipe information of a selected other substrate processing apparatus 100 is displayed. Moreover, the display is color-coded to distinguish between recipe information of other substrate processing apparatuses 100. Thus, the recipe information of the other substrate processing apparatuses 100 can be known. When a selection release button located at the same position as the device selection button is pressed, the screen is switched to the recipe information of the substrate processing apparatus (EQ1) 100.

In this way, when the file management program is executed, it is possible to display the recipe information of the other substrate processing apparatuses (EQ2 to EQ4 in the embodiment) 100 on the recipe information screen of the substrate processing apparatus (EQ1) 100. At this time, the same screen, with the same screen configuration and the recipe information screen of the other substrate processing apparatuses (EQ2 to EQ4 in the embodiment) 100, is displayed with a different color in its entirety including the recipe information. Thus, the recipe information of the substrate processing apparatus (EQ1) 100 and the recipe information of the other substrate processing apparatuses (EQ2 to EQ4 in the embodiment) 100 are prevented from being confused.

(9) Effects According to Some Embodiments

According to the present embodiment, one or more effects set forth below may be achieved.

(a) According to the present embodiment, the management device 500 is configured to exchange predetermined data (predetermined file) with a substrate processing apparatus 100 without performing data processing. This makes it possible to provide inter-device communication with expandability without modification of the management device 500 by using the corresponding device list registered in advance in the management device 500. Further, it is possible to accurately grasp the state of other substrate processing apparatuses 100 on the operation screen of the substrate processing apparatus 100.

(b) In addition, for example, it is possible to copy a device file and an associated file of a newly shipped substrate processing apparatus 100 on a device file and an associated file of a previously shipped substrate processing apparatus 100. Thus, it is possible to arrange device files including the process recipes between the newly shipped substrate processing apparatus 100 and the previously shipped substrate processing apparatus 100. Therefore, it is possible to make a device file of the most suitable substrate processing apparatus 100 among a plurality of substrate processing apparatuses 100. As a result, it is possible to more accurately manage an apparatus difference between the plurality of substrate processing apparatuses 100, thereby improving the quality of substrate processing.

(c) In the past, since the format of S7F25 prescribed in the semi-standard (SEMI E5-1107) was defined as the format between a device and a host, recipes could be exchanged only between the management device 500 and the substrate processing device 100. Therefore, in order to exchange recipes between a certain substrate processing apparatus 100 and another substrate processing apparatus 100, it is necessary to take an operation procedure of two steps between a certain substrate processing apparatus 100 and the management device 500 and between the management device 500 and another substrate processing apparatus using the screen of the management device 500. However, in this embodiment, by using the user definition after S64, it is possible to exchange screen information and file information between the substrate processing apparatuses 100 only through the transmission thereof without involving the management system 500. Therefore, recipes can be exchanged (for example, copied) between the substrate processing apparatuses 100 with fewer steps.

(d) In the management system 500, an identifier and device information a subjected to electronic message interpretation but are configured not to process data information. As a result, electronic messages are substantially transmitted to other substrate processing apparatuses 100 even though they are transmitted through the management system 500. Therefore, the frequency with which a user or a maintenance worker commits a mistake in operation is reduced. As a result, the maintenance work can be shortened, thereby improving the operation rate of substrate processing.

(e) According to the present embodiment, since the user definition after S64, which is defined in the semi-standard (SEMI E5-1107), is used to define the specifications of the "inter-device free request" area between apparatuses, the screen information and the file information can be exchanged between the substrate processing apparatuses 100 only through the transmission thereof without involving the management system 500. Thus, when the device selection button is changed on the file list screen of the device's own apparatus, the file lists of other apparatuses can be displayed on the same screen. This makes it easy to compare files among a plurality of substrate processing apparatuses 100. As a result, it is possible to more accurately manage the apparatus difference, thereby improving the quality of substrate processing.

(f) In a comparative example shown in FIG. 14, the management system 500 has to check the format of an identifier and a recipe request because an electronic message intended for the recipe request (S7F25) has no device information. In addition, the management system 500 cannot transmit the electronic message because the management system 500 does not know a transmission destination of the recipe request (S7F25). However, since the electronic message of the present disclosure includes the identifier (S100F103), the substrate processing apparatus 100 to which the request electronic message as device information is transmitted, and the data information intended for the recipe request, the management system 500 can transmit the electronic message.

(g) According to the present embodiment, the management device 500 can provide a corresponding device list to the substrate processing apparatus 100. Further, when the substrate processing apparatus 100 is powered-on, since the process of acquiring the corresponding device list from the management device 500 is held in the latest corresponding device list in two cases including a case of acquiring the corresponding device list from the management device 500 (S100F101) and a case of notifying the changed device information of the group management system (S100F105), the latest corresponding device list is always updated. Therefore, it is possible to manage device files between the substrate processing apparatuses without leaking Other Embodiments of the Present Disclosure It has been illustrated in the above embodiments that the electronic message management table for managing electronic messages is stored in advance in the data storage part 503 of the management device 500 and is used to transmit the electronic messages. However, the present disclosure may not be limited thereto. For example, as shown in FIG. 15, the electronic message management table maybe omitted by adding a request device as the second device information to the request electronic message and the response electronic message.

In addition, it has been illustrated in the above embodiments that the recipe file is a device file. However, the present disclosure may not be limited thereto. For example, the recipe file may be a file that defines parameters related to the device configuration such as the presence/absence of N2 purge, the full scale of an MFC and the speed of a shaft, a file indicating the alarm occurrence status (usage: comparison of alarms between the master apparatus and repeat apparatus), a file storing monitor data (usage: comparing whether pressure matches up between the master apparatus and the repeat apparatus), etc.

The controller 240 and the management device 500 may not be limited to being configured as a dedicated computer but may be configured as a general-purpose computer. For example, the controller 240 and the management device 500 according to the present embodiment may be configured by installing a program in a general-purpose computer using an external storage device (for example, a magnetic tape, a magnetic disk such as a flexible disk or a hard disk, an optical disk such as a CD or a DVD, a magneto optical disk such as an MO, a semiconductor memory such as a USB memory or a memory card, etc.). A means for supplying a program to a computer may not be limited to the case where the program is supplied via the external storage device 282. For example, a communication means such as the Internet or a private line may be used to supply the program without going through the external storage device. In this case, for example, the program may be posted on a bulletin board (BBS) of a communication network and may be supplied by superimposing the program on a carrier wave via the network. By starting the program supplied in this manner and executing it in the same way as other application programs under the control of an OS, the above-described processes can be executed. The data holding part 239e, the data storage part 503 and the external storage device are configured as a computer readable recording medium. In the present disclosure, these are collectively referred to simply as a recording medium. The term "recording medium" used herein may include only the data holding part 239e or the data storage part 503, only the external storage device, only two of the data holding part 239e, the data storage part 503 and the external storage device, or all of them.

Further, the present disclosure may not be limited to a case where the substrate processing apparatus 100 and the management device 500 are disposed in the same floor (in the same clean room). For example, the substrate processing apparatus 100 may be disposed in a clean room, the management device 500 may be disposed in an office (on a floor different from the clean room), and data such as monitor data may be remotely exchanged between these apparatuses 100 and the management device 500 via the network 400 such as an LAN. Alternatively, only a part of the configuration of the management device 500, for example, only the data display part 505, may be disposed in the office. Even in such a case, it is possible to exchange data between substrate processing apparatuses 100 through the management device 500 on the screens of the substrate processing apparatuses 100.

Further, the present disclosure can be applied not only to a case where a film forming process of forming various films such as an oxide film, a nitride film, a metal film or the like is performed, but also to a case where other substrate processing processes such as a diffusion process, an annealing process, an oxidation process, a nitridation process, a lithography process and the like are performed. In addition to the thin film forming apparatus, the present disclosure can also be applied to other substrate processing apparatuses such as an etching apparatus, an annealing processing apparatus, an oxidation processing apparatus, a nitridation processing apparatus, an exposure apparatus, a coating apparatus, a molding apparatus, a developing apparatus, a dicing apparatus, a wire bonding apparatus, a drying apparatus, a heating apparatus, an inspection apparatus and the like. In the present disclosure, these apparatuses may be used in combination. Further, the present disclosure may not be limited to the vertical type substrate processing apparatus 100 but may be applied to a horizontal type substrate processing apparatus or a single wafer type substrate processing apparatus. In the present disclosure, these apparatuses may be used in combination.

Further, the present disclosure is not limited to a semiconductor manufacturing apparatus or the like for processing a semiconductor wafer, such as the substrate processing apparatus 100 according to the present embodiment, but may be applied to other substrate processing apparatuses such as an LCD (Liquid Crystal Display) manufacturing apparatus for processing a glass substrate.

According to the present disclosure in some embodiments, it is possible to manage device files between substrate processing apparatuses.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

INDUSTRIAL APPLICABILITY

The present disclosure can be applied to a substrate processing system including at least a substrate processing apparatus for processing a substrate and a management device for managing the substrate processing apparatus.

What is claimed is:

1. A substrate processing system comprising: a plurality of substrate processing apparatuses; and a controller configured to manage the plurality of substrate processing apparatuses, wherein, upon receiving, by the controller, information specifying a substrate processing apparatus as a reference and file information designating a predetermined device file, the plurality of substrate processing apparatuses transmits request data including first device information indicating the reference substrate processing apparatus and first data information associated with the predetermined device file to the controller, wherein, upon receiving the request data, the controller transmits the received request data to the reference substrate processing apparatus, wherein the reference substrate processing apparatus creates response data including second data information responding to the first data information based on the received request data and transmits the created response data to the controller, wherein, upon receiving the response data, the controller transmits the received response data to the plurality of substrate processing apparatuses, and wherein the plurality of substrate processing apparatuses acquires the second data information from the response data, and wherein the controller comprises a corresponding device list comprising unique information of a previously registered substrate processing apparatus, and an electronic message management table comprising, as items, an item number, the first device information, second device information indicating the substrate processing apparatuses, and an identifier, and wherein the controller processes the request data received from the substrate processing apparatuses, compares the processed request data with the corresponding device list to calculate the second device information, and registers the calculated second device information in the electronic message management table.

2. The substrate processing system of claim 1, wherein the plurality of substrate processing apparatuses transmits data requesting the corresponding device list to the controller, and wherein the controller transmits the corresponding device list to the plurality of substrate processing apparatuses.

3. The substrate processing system of claim 1, wherein, upon receiving the request data from the plurality of substrate processing apparatuses, the controller is configured to process the first device information and not to process the first data information.

4. The substrate processing system of claim 1, wherein the controller is configured to transmit the request data received from the plurality of substrate processing apparatuses to the reference substrate processing apparatus based on the first device information.

5. The substrate processing system of claim 1, wherein the controller is configured to process the response data received from the reference substrate processing apparatus, compare the processed response data with the electronic message management table, transmit the response data to the substrate processing apparatuses, and erase the information of the electronic message management table.

6. The substrate processing system of claim 1, wherein the plurality of substrate processing apparatuses, which are connected to the controller, wherein, when a new substrate processing apparatus is connected, the controller transmits data notifying of an update to the corresponding device list to each of the connected substrate processing apparatuses, and wherein each of the plurality of substrate processing apparatuses reflects unique information of the new substrate processing apparatus in the corresponding device list and transmits data responding to the data notifying the update to the corresponding device list to the controller.

7. The substrate processing system of claim 6, wherein the new substrate processing apparatus receives the data notifying the update to the corresponding device list and creates a corresponding device list including unique information of each of the plurality of substrate processing apparatuses connected to the controller.

8. The substrate processing system of claim 1, wherein the first data information is information associated with the predetermined device file, and wherein the second data information is information including a file associated with the predetermined device file.

9. The substrate processing system of claim 8, wherein the predetermined device file is a process recipe file, and wherein the file associated with the predetermined device file is at least one file selected from a group consisting of a sub recipe file, a temperature control file, a pressure control file and a transfer parameter file.

10. The substrate processing system of claim 1, wherein each of the plurality of substrate processing apparatuses further includes a data display that displays a device selection button for selecting at least one of the plurality of substrate processing apparatuses defined in a corresponding device list, wherein, when the device selection button is pressed, a device selection screen other than the device displaying the device selection button is displayed, and wherein, when a device name displayed on the device selection screen is selected, a screen of the selected other device is displayed.

11. The substrate processing system of claim 10, wherein the screen of the device displaying the device selection button and the screen of the other device have the same screen configuration.

12. The substrate processing system of claim 10, wherein the screen of the device displaying the device selection button and the screen of the other device are displayed with different colors of the entire screen on which information is displayed.

13. The substrate processing system of claim 10, wherein, when displaying the screen of the other device by changing a color of the entire screen on which the information is displayed, the screen of the other device returns to the screen of the own device when the device selection button is pressed.

* * * * *